United States Patent
Magcale et al.

(10) Patent No.: US 11,224,145 B2
(45) Date of Patent: Jan. 11, 2022

(54) DATACENTER GEOTHERMAL COOLING SYSTEM AND METHOD

(71) Applicant: Nautilus Data Technologies, Inc., Pleasanton, CA (US)

(72) Inventors: Arnold Magcale, Danville, CA (US); Byron Putnam Taylor, San Jose, CA (US); Chase Abercrombie Ott, San Rafael, CA (US)

(73) Assignee: Nautilus TRUE, LLC, Pleasanton, CA (US)

( * ) Notice: Subject to any disclaimer, the term of this patent is extended or adjusted under 35 U.S.C. 154(b) by 144 days.

(21) Appl. No.: 16/052,273

(22) Filed: Aug. 1, 2018

(65) Prior Publication Data

US 2020/0045857 A1    Feb. 6, 2020

(51) Int. Cl.
*H05K 7/20* (2006.01)
*F24F 5/00* (2006.01)
*F24F 13/28* (2006.01)
*F24F 11/46* (2018.01)
*F24T 10/00* (2018.01)

(52) U.S. Cl.
CPC ....... *H05K 7/20836* (2013.01); *F24F 5/0046* (2013.01); *F24F 11/46* (2018.01); *F24F 13/28* (2013.01); *H05K 7/2039* (2013.01); *H05K 7/20272* (2013.01); *H05K 7/20781* (2013.01); *F24F 2005/0057* (2013.01); *F24T 2010/56* (2018.05)

(58) Field of Classification Search
CPC .......... H05K 7/20836; H05K 7/20272; H05K 7/2039; H05K 7/20781; F24F 11/46; F24F 5/0046; F24F 13/28
See application file for complete search history.

(56) References Cited

U.S. PATENT DOCUMENTS

| | | | | |
|---|---|---|---|---|
| 3,902,547 A * | 9/1975 | Waters | .................... | E02D 3/115 165/45 |
| 3,939,659 A * | 2/1976 | Matthews | ................. | F03G 7/04 60/641.4 |
| 4,144,722 A * | 3/1979 | Mattwell | ................... | C02F 1/36 62/305 |
| 4,704,202 A * | 11/1987 | Poyner | .................. | B01D 29/54 210/108 |
| 6,688,129 B2 * | 2/2004 | Ace | ....................... | F24F 5/0046 62/260 |
| 7,124,597 B2 * | 10/2006 | Kattner | ................. | F25B 25/005 62/260 |
| 9,212,835 B1 * | 12/2015 | Berens | .................. | E04H 4/1245 |

(Continued)

*Primary Examiner* — Devon Russell
(74) *Attorney, Agent, or Firm* — Michael D. Eisenberg

(57) ABSTRACT

A cooling apparatus and method comprising a heat exchanger in thermal communication with a plurality of computing devices, a single or plurality of filtered coolant intake pipes and corresponding coolant exhaust pipes in thermal communication with the heat exchanger via a configurable filtration unit. The apparatus and method includes a geothermal heat sink comprised in a geothermal field, structured to transport heat away from the heat exchanger via the filtered coolant intake and exhaust pipes, and a coolant pump operatively coupled to the coolant intake and coolant exhaust pipes in a coolant circuit and configured to transport heat absorbed by the heat exchanger to the geological heat sink comprised in the geothermal field.

16 Claims, 2 Drawing Sheets

(56) References Cited

U.S. PATENT DOCUMENTS

| | | | | |
|---|---|---|---|---|
| 9,488,388 | B1* | 11/2016 | Siegenthaler | F24T 10/00 |
| 10,394,290 | B2* | 8/2019 | Hardin | H05K 7/2079 |
| 2007/0023163 | A1* | 2/2007 | Kidwell | F28D 15/0233 |
| | | | | 165/45 |
| 2010/0038052 | A1* | 2/2010 | Johnson | F24T 10/00 |
| | | | | 165/45 |
| 2010/0139736 | A1* | 6/2010 | Teichmann | H02S 40/44 |
| | | | | 136/246 |
| 2010/0314070 | A1* | 12/2010 | Yang | G05D 23/19 |
| | | | | 165/45 |
| 2011/0042057 | A1* | 2/2011 | Li | F24F 5/0046 |
| | | | | 165/253 |
| 2013/0081781 | A1* | 4/2013 | Chainer | H05K 7/2079 |
| | | | | 165/45 |
| 2013/0333383 | A1* | 12/2013 | Schwarck | F24T 10/17 |
| | | | | 60/641.2 |
| 2014/0299174 | A1* | 10/2014 | Yu | H01L 31/0521 |
| | | | | 136/246 |
| 2015/0114019 | A1* | 4/2015 | Van Gysel | F24D 3/18 |
| | | | | 62/238.7 |
| 2020/0107475 | A1* | 4/2020 | Keisling | F25D 17/00 |

* cited by examiner

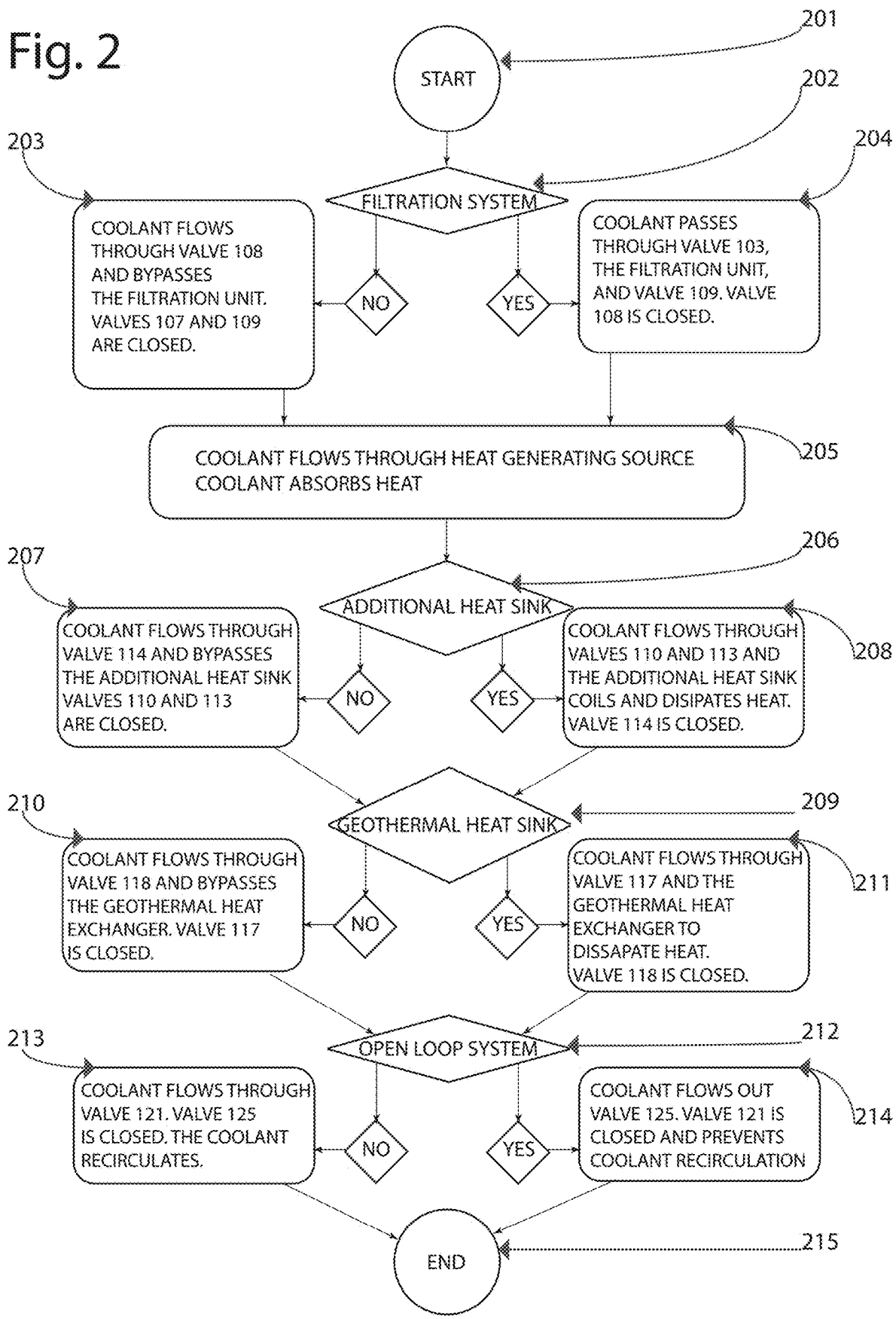

DATACENTER GEOTHERMAL COOLING SYSTEM AND METHOD

FIELD

The present invention relates to geothermal supported cooling facilities for data centers.

BACKGROUND OF THE INVENTION

Data centers and co-location providers in particular struggle with both supplying requisite power as well as cooling. As data center density continues to increase there is a growing demand for more energy efficient and cost effective data centers and colocation solutions.

A data center is designed to maintain interior ambient conditions suitable for proper operation of the computer systems therein. Typical data centers may consume more than twice the power needed to support the plurality of computer systems housed therein. This is a result of the inefficient air conditioning units that may account for half of the total power consumed in the data center to cool the plurality of computer systems therein. This inefficiency prohibits support of high density computing systems in today's data centers.

Embodiments disclosed include open and closed-looped, energy efficient, cost effective thermal management systems that leverage natural surrounding geothermal resources, including underground water, to control thermal conditions and to reduce the overall requirement for cooling power in data centers.

A data center is a facility designed to house, maintain, and power a plurality of computer systems. The computer systems within the data center are generally rack mounted within a support frame referred to as a rack. The data center is designed to maintain interior ambient conditions suitable for proper operation of the computer systems therein.

A key constraint of the data center is cooling capacity. Each watt consumed by the computer systems is a watt of waste heat that must be removed to maintain suitable operating temperature. Conventional data centers employ air conditioning units to maintain suitable operating temperatures. The air conditioning units are inefficient and account for more than half of the total power consumed in the data center.

As power density in data centers continues to increase, data center providers struggle with cooling demands that can quickly outstrip the data center capabilities. Conventional data centers employ traditional air conditioning units to maintain suitable operating temperatures for the plurality of computer systems therein. These air conditioning units are inefficient and may account for half of the power consumed in the data center facility. This inefficiency prohibits support of high-density computer systems in data centers.

The methods and systems for a water based closed-loop cooling system described, using geological heat sinks including naturally cold water as a heat sink in a plurality of heat exchange systems, consume substantially less power to maintain interior ambient conditions suitable for proper operation of the computer systems therein when compared to traditional air conditioning units.

SUMMARY

Embodiments disclosed include a cooling apparatus comprising a heat exchanger in thermal communication with a plurality of computing devices. According to an embodiment, a single or plurality of filtered coolant intake pipes and corresponding coolant exhaust pipes are in thermal communication with the heat exchanger via a configurable filtration unit. A geothermal heat sink is comprised in a geothermal field, and structured to transport heat away from the heat exchanger via the filtered coolant intake and exhaust pipes. Additionally, a coolant pump is operatively coupled to the coolant intake and coolant exhaust pipes in a coolant circuit and is configured to transport heat absorbed by the heat exchanger to the geological heat sink comprised in the geothermal field.

According to an embodiment of the cooling apparatus, the coolant circuit is a hybrid closed and open loop coolant circuit comprising a first computer controlled inflow valve configured to block coolant inflow through the filtered coolant intake pipes and a second computer controlled outflow valve configured to block coolant outflow through the filtered coolant exhaust pipes such that coolant is pumped through the heat exchanger in a closed loop. The closed loop is in thermal communication with the heat exchanger and the geothermal heat sink such that the geothermal heat sink dissipates heat absorbed by the flowing coolant from the heat exchanger in the closed loop.

Embodiments disclosed include, in a cooling apparatus, a method comprising transporting heat away from a heat exchanger in thermal communication with a plurality of computing devices via a single or plurality of filtered coolant intake pipes and corresponding coolant exhaust pipes in thermal communication with the heat exchanger via a configurable filtration unit. The method preferably comprises transporting the heat to a geothermal heat sink comprised in a geothermal field, structured to transport heat away from the heat exchanger via the filtered coolant intake and exhaust pipes. According to an embodiment of the method, transporting of heat is enabled by a coolant pump operatively coupled to the coolant intake and coolant exhaust pipes in a coolant circuit and configured to transport heat absorbed by the heat exchanger to the geological heat sink comprised in the geothermal field.

According to an embodiment of the method, transporting of heat via the coolant circuit comprises transporting of heat via a hybrid closed and open loop coolant circuit comprising a first computer controlled inflow valve configured to block coolant inflow through the filtered coolant intake pipes and a second computer controlled outflow valve configured to block coolant outflow through the filtered coolant exhaust pipes such that coolant is pumped through the heat exchanger in a closed loop. Preferably, the closed loop is in thermal communication with the heat exchanger and the geothermal heat sink such that the geothermal heat sink dissipates heat absorbed by the flowing coolant from the heat exchanger in the closed loop.

BRIEF DESCRIPTION OF THE DRAWINGS

FIG. 2 illustrates the method 200 according to an embodiment.

DETAILED DESCRIPTION

Figure 1:
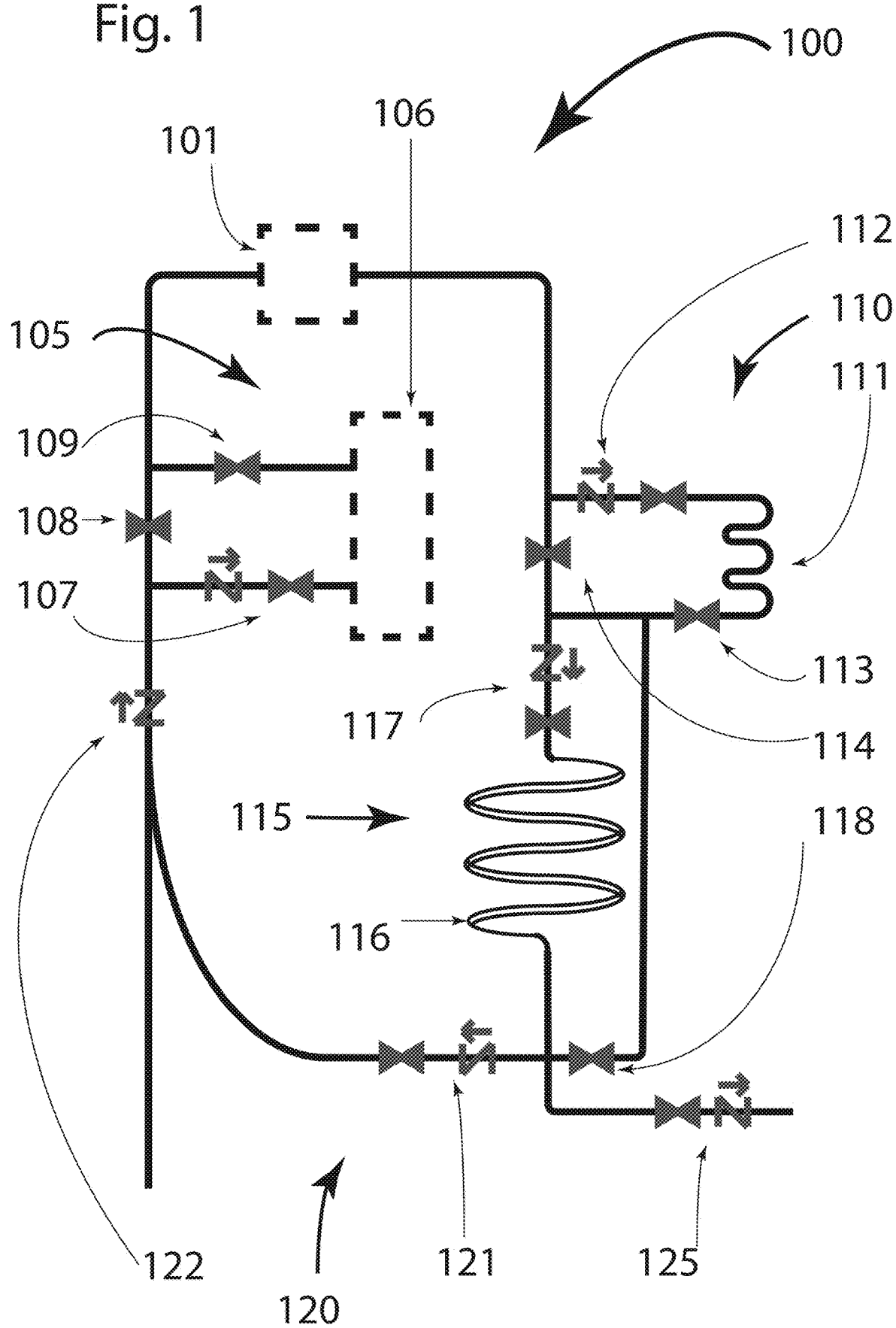
FIG. 1 illustrates the geothermal cooling apparatus according to an embodiment.

The following is a detailed description of embodiments of the invention depicted in the accompanying drawings. The embodiments are introduced in such detail as to clearly communicate the invention. However, the embodiment(s) presented herein are merely illustrative, and are not intended to limit the anticipated variations of such embodiments; on the contrary, the intention is to cover all modifications, equivalents, and alternatives falling within the spirit and scope of the appended claims. The detailed descriptions below are designed to make such embodiments obvious to those of ordinary skill in the art.

As stated above, the traditional way of monitoring data center infrastructure, collecting data from infrastructure systems, and managing the systems to allow maximizing the operational efficiency is now struggling to cope with new challenges brought by the growing complexity of data centers. Traditional cooling systems and methods are hopelessly inadequate in light of current scale and increased compute density. Embodiments disclosed include systems and methods that address these challenges effectively and efficiently.

According to an embodiment, a cooling apparatus comprising a heat exchanger in thermal communication with a plurality of computing devices is disclosed. The cooling apparatus comprises a single or plurality of filtered coolant intake pipes and corresponding coolant exhaust pipes in thermal communication with the heat exchanger via a configurable filtration unit. A geothermal heat sink is comprised in a geothermal field, and structured to transport heat away from the heat exchanger via the filtered coolant intake and exhaust pipes. Preferably, a coolant pump is operatively coupled to the coolant intake and coolant exhaust pipes in a coolant circuit and is configured to transport heat absorbed by the heat exchanger to the geological heat sink comprised in the geothermal field. An ideal embodiment comprises a variable frequency drive (VFD) pump configured to alter the rate of flow of coolant, based upon a detected heat transfer requirement. According to an embodiment, the coolant circuit in the cooling apparatus is at least one of a closed loop and an open loop coolant circuit.

According to a preferred embodiment, the coolant circuit is a hybrid closed and open loop coolant circuit comprising a first computer controlled inflow valve configured to block coolant inflow through the filtered coolant intake pipes and a second computer controlled outflow valve configured to block coolant outflow through the filtered coolant exhaust pipes such that coolant is pumped through the heat exchanger in a closed loop. Preferably, the closed loop is in thermal communication with the heat exchanger and the geothermal heat sink such that the geothermal heat sink dissipates heat absorbed by the flowing coolant from the heat exchanger in the closed loop.

According to an embodiment of the cooling apparatus, the heat exchanger is coupled to the configurable filtration unit which comprises a computer controlled inflow and outflow valve wherein in an open loop condition the coolant is caused to flow through the configurable filtration unit and in a closed loop condition the coolant is caused to bypass the configurable filtration unit.

A preferred embodiment is designed to operate in both an open and closed loop configuration. In an open loop configuration the computer controlled inflow and outflow valves are open and cause the coolant to enter the configurable filtration unit, and in a closed loop configuration the computer controlled inflow and outflow valves are closed and cause the coolant to bypass the configurable filtration unit.

According to an embodiment, the closed loop is at least one of a horizontal closed loop, a vertical closed loop, a pond loop, and a slinky loop. In one embodiment, at least one of water and glycol is used as a coolant. Other alternatives and refrigerants may be used, especially in closed loop configurations, as would be apparent to a person having ordinary skill in the art.

According to an embodiment, the geothermal heat sink is an underground water source. According to another embodiment, the earth is used as a heat sink to take advantage of cooler underground temperatures wherein piping is embedded to cause the water to flow in a closed loop configuration. Preferably, the piping is embedded at a depth of at least twelve feet. Usually, the embedded piping comprises piping having a diameter in the range of 8 inches to 36 inches. Alternate depths and piping diameters are possible, as would be apparent to a person having ordinary skill in the art.

Embodiments disclosed include embedded piping built from at least one of titanium, aluminum, poly-high density material, and polyethylene. Preferably, the piping comprises internal fins that obstruct the fast flow of water, enhancing heat absorption.

As stated above, the geothermal heat sink could be an underground water source. According to some embodiments, geothermal systems include heat pumps that enable quick heat transfer. Also, as stated above, when the earth is used as a heat sink, in preferred embodiments, a series of pipes, commonly called a "loop," carry a fluid used to connect the geothermal system's heat pump to the earth.

Closed and Open Loops

Open loop systems are the simplest. Ground water is drawn from an aquifer through one well, passes through the heat exchanger via the filtered water intake pipes, and is discharged to the same aquifer through a second well at a distance from the first via the filtered water exhaust pipes. According to an embodiment, two to three gallons per minute per ton of capacity are necessary for effective heat exchange. Since the temperature of ground water is nearly constant throughout the year, open loops are a popular and economic option.

An embodiment includes leveraging even an open body of water. In one embodiment a data center (heat generating source comprising several computer systems) is built on an artificial or natural island surrounded by a moat like open body of water. The open body of water is vulnerable to changes in environmental temperature. An embodiment includes surrounding the open body of water with solar electricity generating panels that provide shade to keep the water cool in particularly hot weather. The solar panels serve the additional purpose of preventing water evaporation in particularly hot weather. Additionally the solar panels generate electricity that could be used to cool the water, to power the data center, or/and to resell the generated electricity to interested buyers like the city. Thus, according to an embodiment, systems and methods are designed to capture solar energy around a natural, environmentally exposed body of water. Embodiments disclosed enable solar power generating systems that prevent evaporation of water by providing shade to the water body, that have the capacity to cool the water through captured solar energy, and further provide a protective barrier and thus safety from drowning related incidents.

Open loop systems do have some associated challenges: In some embodiments, geothermal based cooling apparatuses and methods include heat pumps, and some local ground water chemical conditions can lead to fouling the heat pump's heat exchanger. Such situations may require precautions to keep carbon dioxide and other gases in solution in the water. Other options include the use of cupronickel heat exchangers and heat exchangers that can be cleaned without introducing chemicals into the groundwater.

Closed loop systems, when properly installed, are economical, efficient, and more reliable. Water (or a water and antifreeze solution, or a coolant) is circulated through a continuous buried pipe keeping. The closed loop system is environmentally friendly because water in the loop prevents contamination to the external environment. The length of loop piping varies depending on ground temperature, thermal conductivity of the ground, soil moisture, and system design. (Some heat pumps work well with larger inlet temperature variations, which allows marginally smaller loops).

FIG. 1 illustrates the geothermal cooling apparatus 100 according to an embodiment. The figure illustrates a heat exchanger in thermal communication with a plurality of heat generating sources (computing devices) 101. The cooling apparatus comprises a single or plurality of filtered coolant intake pipes flowing through a directional flow valve and further through filtration loop 105 comprised in filtration unit 106, and corresponding coolant exhaust pipes in thermal communication with the heat exchanger and geothermal field 115, structured to transport heat away from the heat exchanger to geothermal heat exchanger 116 comprised in geothermal field 115. Uni-directional (one-way) valve 107 comprised in filtration loop 105 and coupled to filtration bypass valve 108 and uni-directional valve 109 wherein in an open loop condition valves 107 and 109 are caused to be open and valve 108 is closed thereby enabling coolant to pass through the filtration unit. Open loop systems generally use fresh water as a coolant drawn from a natural water source. In a closed loop condition filtration bypass valve 108 is open while valves 107 and 109 are closed. The illustrated embodiment includes a secondary heat sink 110 comprising heat exchange coils to absorb heat or and utilize the absorbed heat to serve an additional purpose. In an example embodiment, the heat may be used to fulfil or supplement the heating requirements of a building. In another embodiment the heat may be used to fulfil or supplement the hot water requirements of an industrial or residential facility. Other variations and modifications are possible, as would be apparent to a person having ordinary skill in the art. The secondary heat sink 110 comprises unidirectional valves 112, 113 and secondary heat sink bypass valve 114 wherein the secondary heat sink is activated by opening valves 112 and 113 and closing valve 114. The secondary heat sink is de-activated (shut down) by opening valve 114 and closing valves 112 and 113. In a preferred embodiment, valves 112, 113 and 114 operate in unison wherein valve 114 opens automatically when valves 112 and 113 are closed, and vice versa.

According to the illustrated embodiment, geothermal field 115 comprises geothermal loop coils 116 in a spiral orientation. Alternate orientations of geothermal loop coils are possible as would be apparent to a person having ordinary skill in the art. The embodiment includes uni-directional valve 117 to enable the geothermal closed loop operation. And further, the embodiment includes valve 118 to enable operation in an open loop condition and bypass the geothermal closed loop operation. Valve 120 enables a closed feedback loop operation and uni-directional valve 121 serves to close the loop. Uni-directional control valve 122 forces the water, coolant, fluid or refrigerant to flow in one counter-clockwise direction only. In the illustrated embodiment, in this orientation, some of the fluid will recirculate. Some fluid also exits in the open loop.

Preferably a variable frequency drive (VFD) pump is operatively coupled to the coolant intake and exhaust pipes in the coolant circuit and is configured to transport heat absorbed by the coolant from the heat exchanger to the geological heat sink (geothermal loop coil 116).

In one embodiment, the geothermal heat sink is an underground water source such as an aquifer or/and a natural water body. This is an open loop condition wherein water is drawn from the aquifer or/and natural water body. In another embodiment the earth is used as a heat sink to take advantage of cooler underground temperatures wherein piping is embedded to cause the water or coolant to flow. Here a closed loop operation is preferred. In a preferred embodiment the geothermal system comprises a heat pump. Preferably, a series of pipes, commonly called a "loop," carry a fluid used to connect the geothermal system's heat pump to the earth. The underground piping can be as low as 12 feet and can range from 12 to 1000 feet depending upon the requirement and the earth condition.

Further, according to one embodiment, the closed and open loop is at least one of a horizontal closed loop, a vertical closed loop, a pond loop, and a slinky loop. Each of the loops may include underground piping that ranges from 8 inches in diameter to 36 inches in diameter and is built from highly resilient and highly conductive heat absorbing materials. Some embodiments use titanium, aluminum, or/and a poly-high density material. Polyethylene is the most common pipe material used in ground source heat exchangers. It is flexible and can be heat fused to form joints stronger than the pipe itself. According to a preferred embodiment, the piping is infused with internal fins that obstruct the fast flow of water or other coolant, thereby enhancing heat absorption. The objective is essentially to cause turbulent water or coolant flow to facilitate quicker heat dissipation. Thus, other variations and modifications are possible, as would be apparent to a person having ordinary skill in the art.

According to an embodiment of a cooling apparatus, a method is disclosed comprising, transporting heat away from a heat exchanger in thermal communication with a plurality of computing devices via a single or plurality of filtered coolant intake pipes and corresponding coolant exhaust pipes in thermal communication with the heat exchanger via a configurable filtration unit. The method includes transporting the heat to a geothermal heat sink comprised in a geothermal field, structured to transport heat away from the heat exchanger via the filtered coolant intake and exhaust pipes. Preferably, the transporting of heat is enabled by a coolant pump operatively coupled to the coolant intake and coolant exhaust pipes in a coolant circuit and configured to transport heat absorbed by the heat exchanger to the geological heat sink comprised in the geothermal field. An ideal embodiment comprises a variable frequency drive (VFD) pump configured to alter the rate of flow of coolant, based upon a detected heat transfer requirement. Some embodiments also deploy a heat pump operatively coupled to the geological heat sink comprised in the geothermal field. According to an embodiment, the coolant circuit in the cooling apparatus is at least one of a closed loop and an open loop coolant circuit.

In a preferred embodiment, the transporting of heat via the coolant circuit comprises transporting of heat via a hybrid closed and open loop coolant circuit comprising a first computer controlled inflow valve configured to block coolant inflow through the filtered coolant intake pipes and a second computer controlled outflow valve configured to block coolant outflow through the filtered coolant exhaust pipes such that coolant is pumped through the heat exchanger in a closed loop. The closed loop ideally is in thermal communication with the heat exchanger and the geothermal heat sink such that the geothermal heat sink dissipates heat absorbed by the flowing coolant from the heat exchanger in the closed loop.

According to an embodiment, the method comprises causing the coolant to flow through a configurable filtration unit comprising a computer controlled inflow and outflow valve and coupled to the heat exchanger in an open loop condition, and causing the coolant to bypass the configurable filtration unit in a closed loop condition. In an open loop condition the inflow and outflow valves are open and cause the coolant to enter the configurable filtration unit, and in a closed loop condition the inflow and outflow valves are closed and cause the coolant to bypass the configurable filtration unit.

In an embodiment of the method, the geothermal heat sink is comprised in an underground water source. In another embodiment, piping (the heat sink) is embedded in the earth to take advantage of cooler underground temperatures wherein coolant is caused to flow through the embedded piping in a closed loop configuration. And as described above, the piping is embedded at a depth of at least twelve feet. And preferably, transporting heat through the closed loop comprises transporting heat through at least one of a horizontal closed loop, a vertical closed loop, a pond loop, and a slinky loop.

In one embodiment, the geothermal heat sink is an underground water source such as an aquifer or/and a natural water body. In an open loop condition water is drawn from the aquifer or/and natural body and is ejected back into the aquifer or/and natural body some distance away from where it is drawn. In another embodiment the earth is used as a heat sink to take advantage of cooler underground temperatures wherein piping is embedded, and water as a coolant, is caused to flow in a closed loop configuration. Embodiments disclosed include transporting heat through the closed loop through at least one of a horizontal closed loop, a vertical closed loop, a pond loop, and a slinky loop.

FIG. 2 illustrates the method 200 according to an embodiment. Step 201 initiates the method, and in a preferred embodiment a computer controlled monitoring system checks for an open or closed loop configuration requirement 202. If the requirement is for a closed loop configuration, the computer controlled monitoring system causes valves 107 and 109 to close, and valve 108 to open, enabling the flowing coolant to bypass the filtration unit. In an open loop configuration requirement, the computer controlled monitoring system causes valves 107 and 109 to open and valve 108 to close causing the flowing coolant to pass through the filtration unit. In step 205 the coolant is caused to flow through a single or plurality of heat exchangers operatively coupled to the heat generating sources, namely, data center computer systems according to an embodiment. According to an embodiment, utilizing the secondary heat sink can be automated and the computer controlled monitoring system can activate utilization of the secondary heat sink. If the secondary heat sink is not required to be utilized 206, the computer controlled monitoring system causes valves 110 and 113 to close, and valve 114 to open such that the coolant does not flow through the secondary heat sink as illustrated in step 207. If the secondary heat sink is required to be utilized the computer controlled monitoring system causes valves 110 and 113 to open, and valve 114 to close such that the coolant flows through the secondary heat sink. According to the illustrated embodiment, even the geothermal heat sink may be used as per an estimated requirement. If the geothermal heat sink is used (step 209), then the computer controlled monitoring system causes valve 117 to open, valve 118 to close thereby enabling coolant flow through the geothermal heat sink. And in step 210, valve 117 is closed and valve 118 is open so that coolant does not flow through the geothermal heat sink. In an open loop configuration 212, valve 121 is closed, valve 125 is open, and coolant is ejected from the loop through coolant exhaust pipes. In a closed loop configuration 213, valve 121 is open, valve 125 is closed, and coolant is recirculated through the system. Step 215 concludes the method.

Embodiments disclosed enable low cost operation and capital investment. Embodiments are configurable for scaling up over a period of time. Embodiments disclosed reduce or eliminate the need for conventional air-conditioning and therefore result in reduced electricity consumption, thereby reducing the environmental impact and $CO_2$ emissions significantly. Additionally, disclosed embodiments reduce the need for water, thereby enhancing water availability, generally. Embodiments disclosed include a secondary heat sink to harvest and effectively use waste heat.

Embodiments disclosed enable movement of large amounts of thermal energy generated by huge data centers. The earth, from a depth of 12-600 feet or thereabouts, serves as an extremely effective heat sink for dissipation of data center heat, and is relatively unaffected by surface environmental conditions. Further, recovery of heat from the underground can now be accomplished during cold weather periods using the same heat exchangers coupled with surface equipment such as the secondary heat sink and operatively coupled heat pumps. Embodiments disclosed that implement closed loop configurations use very little water (or coolant refrigerant). Further, alternate embodiments may deploy a small chiller system operating at off peak hours when electricity rates are minimal or when renewable resources are available. Then the geothermal field can be even smaller and thus more cost effective.

Since various possible embodiments might be made of the above invention, and since various changes might be made in the embodiments above set forth, it is to be understood that all matter herein described or shown in the accompanying drawings is to be interpreted as illustrative and not to be considered in a limiting sense. Thus it will be understood by those skilled in the art of systems and methods that facilitate cooling of electronic systems, and more specifically automated cooling infrastructure especially pertaining to data centers, that although the preferred and alternate embodiments have been shown and described in accordance with the Patent Statutes, the invention is not limited thereto or thereby.

The figures illustrate the architecture, functionality, and operation of possible implementations of systems, methods and computer program products according to various embodiments of the present invention. It should also be noted that, in some alternative implementations, the functions noted/illustrated may occur out of the order noted in the figures. For example, two blocks shown in succession may, in fact, be executed concurrently, or the blocks may sometimes be executed in the reverse order, depending upon the functionality involved.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In general, the routines executed to implement the embodiments of the invention, may be part of an operating system or a specific application, component, program, module, object, or sequence of instructions. The computer program of the present invention typically is comprised of a multitude of instructions that will be translated by the native computer into a machine-accessible format and hence executable instructions. Also, programs are comprised of variables and data structures that either reside locally to the program or are found in memory or on storage devices. In addition, various programs described hereinafter may be identified based upon the application for which they are implemented in a specific embodiment of the invention. However, it should be appreciated that any particular program nomenclature that follows is used merely for convenience, and thus the invention should not be limited to use solely in any specific application identified and/or implied by such nomenclature.

The present invention and some of its advantages have been described in detail for some embodiments. It should be understood that although the system and process is described with reference to liquid-cooled conduction cooling structures in data centers, the system and method is highly reconfigurable, and may be used in other contexts as well. It should also be understood that various changes, substitutions and alterations can be made herein without departing from the spirit and scope of the invention as defined by the appended claims. An embodiment of the invention may achieve multiple objectives, but not every embodiment falling within the scope of the attached claims will achieve every objective. Moreover, the scope of the present application is not intended to be limited to the particular embodiments of the process, machine, manufacture, composition of matter, means, methods and steps described in the specification. A person having ordinary skill in the art will readily appreciate from the disclosure of the present invention that processes, machines, manufacture, compositions of matter, means, methods, or steps, presently existing or later to be developed are equivalent to, and fall within the scope of, what is claimed. Accordingly, the appended claims are intended to include within their scope such processes, machines, manufacture, compositions of matter, means, methods, or steps.

We claim:

1. A cooling apparatus comprising:
    a heat exchanger in thermal communication with a plurality of computing devices;
    a single or plurality of filtered coolant intake pipes and corresponding coolant exhaust pipes in thermal communication with the heat exchanger;
    a configurable filtration unit operatively coupled between the single or plurality of filtered coolant intake pipes and the heat exchanger;
    wherein, in a first open loop configuration, computer controlled uni-directional valves 107 and 109 are caused to open and computer controlled uni-directional valve 108 is caused to close, thereby allowing coolant to flow through the configurable filtration unit, and in a second closed loop configuration computer controlled uni-directional valves 107 and 109 are caused to close and computer controlled uni-directional valve 108 is caused to open, thereby disallowing coolant to flow through the configurable filtration unit;
    a geothermal heat sink comprised in a geothermal field, structured to transport heat away from the heat exchanger via the filtered coolant intake and exhaust pipes;
    a secondary heat sink, wherein in a first secondary heat sink configuration, computer controlled uni-directional valves 112 and 113 are caused to open and computer controlled uni-directional valve 114 is caused to close, thereby allowing coolant to flow through the secondary heat sink, and in a second secondary heat sink configuration computer controlled uni-directional valves 112 and 113 are caused to close and computer controlled uni-directional valve 114 is caused to open, thereby disallowing coolant to flow through the secondary heat sink;
    a variable frequency drive coolant pump operatively coupled to the coolant intake and coolant exhaust pipes in a coolant circuit and configured to transport heat absorbed by the heat exchanger to the geological heat sink comprised in the geothermal field; and
    wherein the variable frequency drive coolant pump is configured to alter the rate of flow of coolant based upon a detected heat transfer requirement; and wherein glycol is used as the coolant.

2. The cooling apparatus of claim 1 wherein the coolant circuit is at least one of a closed loop and an open loop coolant circuit.

3. The cooling apparatus of claim 1 wherein the coolant circuit is a hybrid closed and open loop coolant circuit comprising a first computer controlled inflow valve (122) configured to block coolant inflow through the filtered coolant intake pipes and a second computer controlled outflow valve (125) configured to block coolant outflow through the filtered coolant exhaust pipes such that coolant is pumped through the heat exchanger in a closed loop; and
    wherein the closed loop is in thermal communication with the heat exchanger and the geothermal heat sink such that the geothermal heat sink dissipates heat absorbed by the flowing coolant from the heat exchanger in the closed loop.

4. The cooling apparatus of claim 1 wherein: the secondary heat sink is in thermal communication with the coolant exhaust pipes and comprise heat exchange coils wherein the coolant is caused to flow through the heat exchange coils in the first secondary heat sink configuration, and wherein the coolant is caused to bypass the heat exchange coils in the second secondary heat sink configuration.

5. The cooling apparatus of claim 1 wherein the closed loop is at least one of a horizontal closed loop, a vertical closed loop, a pond loop, and a slinky loop.

6. The cooling apparatus of claim 1 wherein the geothermal heat sink is comprised in an underground water source.

7. The cooling apparatus of claim 1 wherein the earth is used as a heat sink to take advantage of cooler underground temperatures wherein piping is embedded to cause the water to flow in a closed loop configuration; and wherein the piping is embedded at a depth of at least twelve feet.

8. The cooling apparatus of claim 7 wherein the embedded piping comprises piping having a diameter in the range of 8 inches to 36 inches.

9. The cooling apparatus of claim 7 wherein the embedded piping is built from at least one of titanium, aluminum, poly-high density material, and polyethylene; and
    wherein the piping comprises internal fins that obstruct the flow of coolant, enhancing heat absorption.

10. In a cooling apparatus, a method comprising:
transporting heat away from a heat exchanger in thermal communication with a plurality of computing devices via a single or plurality of filtered coolant intake pipes and corresponding coolant exhaust pipes in thermal communication with the heat exchanger via a configurable filtration unit;
wherein the configurable filtration unit is operatively coupled between the single or plurality of filtered coolant intake pipes and the heat exchanger;
wherein, in a first open loop configuration, computer controlled uni-directional valves 107 and 109 are caused to open and computer controlled uni-directional valve 108 is caused to close, thereby allowing coolant to flow through the configurable filtration unit, and in a second closed loop configuration computer controlled uni-directional valves 107 and 109 are caused to close and computer controlled uni-directional valve 108 is caused to open, thereby disallowing coolant to flow through the configurable filtration unit;
transporting the heat to a geothermal heat sink comprised in a geothermal field, structured to transport heat away from the heat exchanger via the filtered coolant intake and exhaust pipes;
a secondary heat sink, wherein in a first secondary heat sink configuration, computer controlled uni-directional valves 112 and 113 are caused to open and computer controlled uni-directional valve 114 is caused to close, thereby allowing coolant to flow through the secondary heat sink, and in a second secondary heat sink configuration computer controlled uni-directional valves 112 and 113 are caused to close and computer controlled uni-directional valve 114 is caused to open, thereby disallowing coolant to flow through the secondary heat sink; and
wherein the transporting the heat is enabled by a variable frequency drive coolant pump operatively coupled to the coolant intake and coolant exhaust pipes in a coolant circuit and configured to transport heat absorbed by the heat exchanger to the geological heat sink comprised in the geothermal field; and
wherein the variable frequency drive coolant pump is configured to alter the rate of flow of coolant based upon a detected heat transfer requirement; and wherein glycol is used as the coolant.

11. The method of claim 10 wherein the transporting of heat from the heat exchanger comprises transporting heat via the coolant circuit which is at least one of a closed loop and an open loop coolant circuit.

12. The method of claim 10 wherein the transporting of heat via the coolant circuit comprises transporting of heat via a hybrid closed and open loop coolant circuit comprising a first computer controlled inflow valve (122) configured to block coolant inflow through the filtered coolant intake pipes and a second computer controlled outflow valve (125) configured to block coolant outflow through the filtered coolant exhaust pipes such that coolant is pumped through the heat exchanger in a closed loop; and
wherein the closed loop is in thermal communication with the heat exchanger and the geothermal heat sink such that the geothermal heat sink dissipates heat absorbed by the flowing coolant from the heat exchanger in the closed loop.

13. The method of claim 10 further comprising: causing the coolant to flow through the secondary heat sink in thermal communication with the coolant exhaust pipes and comprising heat exchange coils in the first secondary heat sink configuration, and causing the coolant to bypass the heat exchange coils in the second secondary heat sink configuration.

14. The method of claim 10 wherein the geothermal heat sink is comprised in an underground water source.

15. The method of claim 10 wherein the earth is used as a heat sink wherein piping is embedded to cause the water to flow in a closed loop configuration; and wherein the piping is embedded at a depth of at least twelve feet.

16. The method of claim 10 wherein transporting heat through the closed loop comprises transporting heat through at least one of a horizontal closed loop, a vertical closed loop, a pond loop, and a slinky loop.

* * * * *